United States Patent [19]

Hayashi et al.

[11] 4,105,955
[45] Aug. 8, 1978

[54] HETEROSTRUCTURE LASER HAVING A STRIPE REGION DEFINED IN AN ACTIVE LAYER BY A DIFFERENCE IN IMPURITY

[75] Inventors: Izuo Hayashi; Roy Lang, both of Tokyo, Japan

[73] Assignee: Nippon Electric Co., Ltd., Tokyo, Japan

[21] Appl. No.: 775,839

[22] Filed: Mar. 9, 1977

[30] Foreign Application Priority Data

Mar. 11, 1976 [JP] Japan .................................. 51-26440

[51] Int. Cl.$^2$ .............................................. H01S 3/19
[52] U.S. Cl. .................................. 331/94.5 H; 357/18
[58] Field of Search ..................... 331/94.5 H, 94.5 C; 357/18, 17

[56] References Cited

U.S. PATENT DOCUMENTS

| | | | |
|---|---|---|---|
| 3,783,351 | 1/1974 | Tsukada et al. | 331/94.5 H X |
| 3,790,902 | 2/1974 | Miller | 331/94.5 H X |
| 3,993,964 | 11/1976 | Yonezu | 331/94.5 H |
| 4,002,997 | 1/1977 | Thompson | 331/94.5 H |

OTHER PUBLICATIONS

M. Takusagawa et al., "A New Stripe–Geometry Double Hetrojunction Laser with Internally Striped Planar (ISP) Structure" Conference; 1973 International Electron Devices Meeting, *Technical Digest,* Washington, D.C. USA, (3–5 Dec. 1973), pp. 327–329.

*Primary Examiner*—Stanley D. Miller, Jr.
*Assistant Examiner*—James W. Davie
*Attorney, Agent, or Firm*—Hopgood, Calimafde, Kalil, Blaustein & Lieberman

[57] ABSTRACT

In an active layer restricted by a pair of heterojunctions in a semiconductor laser, a stripe region and a contiguous region are made to have a difference in kinds and/or concentrations of impurity to give the stripe region a higher dielectric constant, preferably by about 0.01–1%, than the contiguous region whereby transverse laser oscillation confined to the active layer by the heterojunctions is further confined to the stripe region in a width direction parallel to the heterojunctions. The dielectric constant profile established in the active layer stabilizes the transverse mode and eliminates nonlinearities in the laser output - exciting current curve as well as other undesirable performance characteristics that are exhibited in conventional stripe-geometry lasers. The difference in the impurity gives the stripe region a narrower band gap of from about 5 to about 100 meV than the contiguous region. For a laser of III-V-Group semiconductor materials, the difference is achieved by doping these regions with an n-type and/or a p-type impurity. The stripe width may be between about 1 micron and several tens of microns. The laser stably produces a single-mode optical output of 10 and 30 mW or more in CW and pulsed operation, respectively.

18 Claims, 33 Drawing Figures

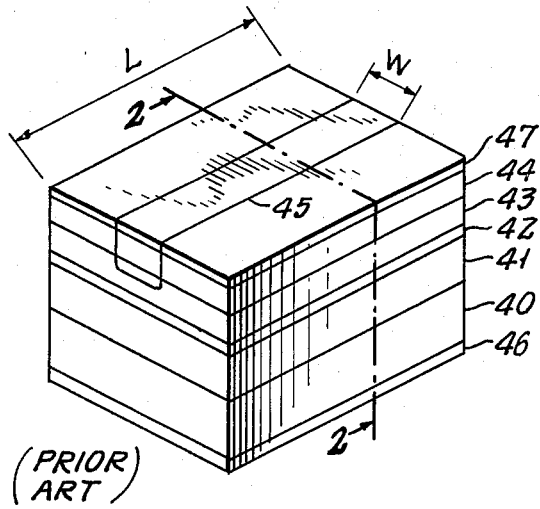
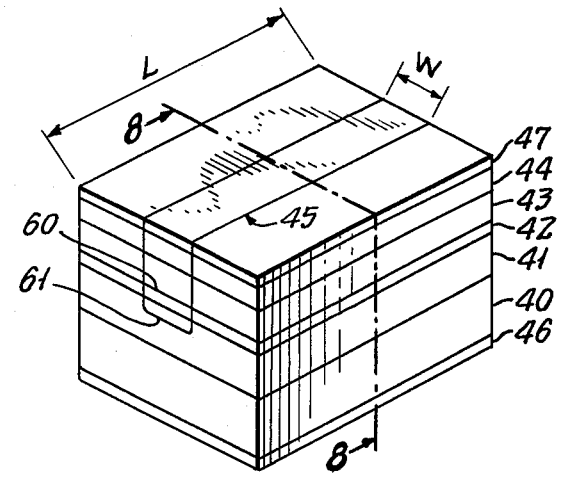
FIG. 1 (PRIOR ART)  FIG. 7
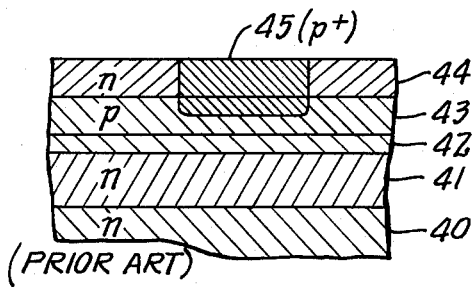
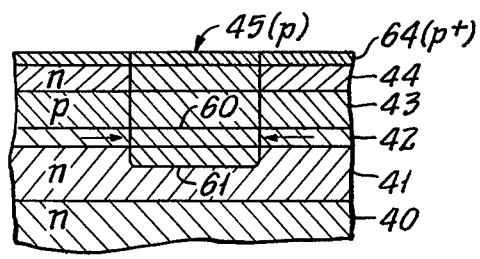
FIG. 2 (PRIOR ART)  FIG. 8
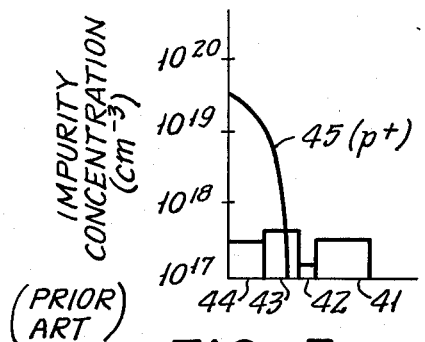
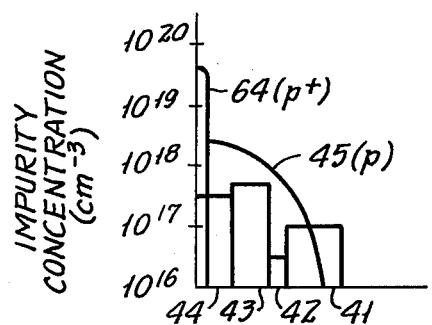
FIG. 3 (PRIOR ART)  FIG. 9
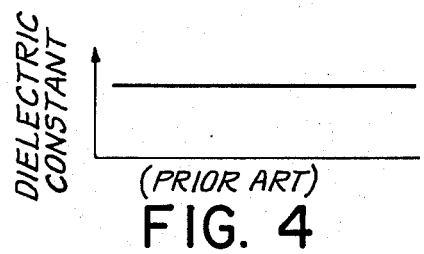
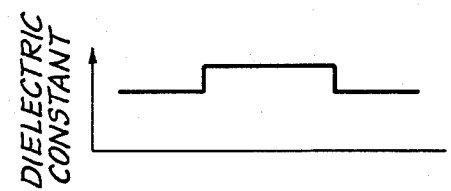
FIG. 4 (PRIOR ART)  FIG. 10

HETEROSTRUCTURE LASER HAVING A STRIPE REGION DEFINED IN AN ACTIVE LAYER BY A DIFFERENCE IN IMPURITY

BACKGROUND OF THE INVENTION

This invention relates to a multiple heterojunction semiconductor laser of a stripe geometry structure.

A strip geometry multiple heterostructure semiconductor laser is generally desirable because of its low threshold exciting current density and its capability of producing an optical output or laser beam with a high efficiency even at room temperature. A laser is often required to have a narrow stripe width so as to produce a small-diameter beam for use in, for example, an optical fiber communication system. The conventional lasers of the type described, however, exhibit various defects. The laser has to be put into operation by a considerably large exciting electric current and yet produce a small-power optical output with a low efficiency and nonlinear optical output versus exciting current characteristics, particularly when the laser has a narrow stripe width. The laser is not sufficiently reliable because it is liable to produce an optical output of higher-order transverse modes, and therefore, become unstable in operation particularly when the laser has a wide stripe width. A buried heterostructure laser is capable of producing a small-diameter beam but is difficult to manufacture. In a laser known as a TJS laser, laser oscillation is absorbed to a considerable extent. The buried heterostructure and TJS lasers are liable to deteriorate and are therefore also unreliable. In some of the conventional lasers, confinement of the laser oscillation is not well achieved.

SUMMARY OF THE INVENTION:

It is therefore an object of the present invention to provide a multiple heterojunction semiconductor laser wherein confinement of laser oscillation is achieved not only electrically but also optically.

It is another object of this invention to provide a laser of the type described, which has a stripe width optionally selected within a considerably wide range, such as from about 1 micron to several tens of microns.

It is still another object of this invention to provide a laser of the type described, which has a very narrow stripe width and yet is readily manufactured.

It is yet another object of this invention to provide a laser of the type described, which can stably produce an optical output of a single fundamental or lower-order transverse mode and is therefore reliable.

It is a further object of this invention to provide a laser of the type described, wherein absorption of laser oscillation is reduced to a minimum.

It is a still further object of this invention to provide a laser of the type described, which is not liable to deteriorate and is therefore reliable.

It is yet further object of this invention to provide a laser of the type described, which can produce an optical output of a high power, such as 10 mW or more in continuous-wave operation and 30 mW or more in pulsed operation by the use of a stripe width of about 15 microns or less, with linear optical output versus exciting current characteristics.

This invention relates more particularly to a stripe geometry heterostructure semiconductor laser comprising a multiple heterojunction semiconductor crystal. The crystal includes an active layer bounded by a pair of heterojunction interfaces and comprising a stripe region and a region contiguous thereto. The interfaces are substantially parallel to each other at least at their portions defining the stripe region. The stripe region is in substantial coincidence with an oscillation producing region where laser oscillation takes place. The oscillation producing region is restricted by the interfaces in a direction perpendicular to the interfaces. In accordance with this invention, the stripe region and the contiguous regions to have a different impurity characteristics to give the stripe region a higher dielectric constant than the contiguous region whereby the oscillation producing region is restricted to the stripe region in another direction parallel to the interfaces. The difference in the impurity characteristic of these regions may give the stripe region a narrower band gap than the contiguous region, and may be differences as to the kinds or conductivity types and/or concentrations of impurities in these regions.

BRIEF DESCRIPTION OF DRAWING

FIG. 1 is a schematic perspective view of a conventional double heterojunction semiconductor laser of a planar stripe geometry structure;

FIG. 2 is a schematic sectional view taken on a plane indicated in FIG. 1 by a line 2—2;

FIG. 3 schematically illustrates the distribution of impurity concentrations in a laser shown in FIGS. 1 and 2;

FIG. 4 shows a typical distribution of the dielectric constant in an active layer of a laser depicted in FIGS. 1 and 2;

FIG. 7 is a schematic perspective view of a double heterojunction semiconductor laser according to a first embodiment of this invention;

FIG. 8 is a schematic sectional view taken on a plane indicated in FIG. 7 by a line 8—8.

FIG. 9 schematically illustrates the distribution of impurity concentrations in the laser shown in FIGS. 7 and 8;

FIG. 10 schematically illustrates the distribution of dielectric constant in an active layer of the laser depicted in FIGS. 7 and 8;

DESCRIPTION OF THE PREFERRED EMBODIMENTS

Figure 5:
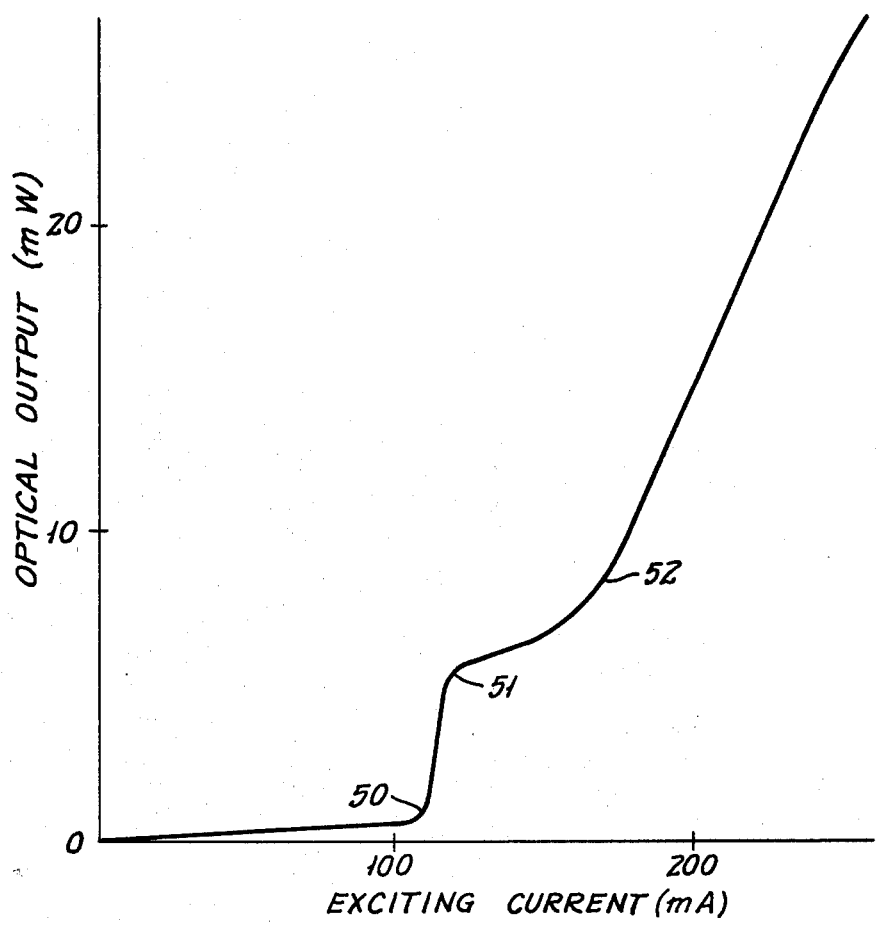
FIG. 5 shows the characteristic curve of a laser illustrated in FIGS. 1 and 2.

Referring to FIGS. 1 through 4, a conventional double heterojunction semiconductor laser of a planar stripe geometry structure will be described at the outset for a better understanding of the present invention. The laser comprises a substrate 40 of an n-type semiconductor material, such as GaAs, a first or base layer 41 of another n-type semiconductor material, such as $Al_xGa_{1-x}As$, a second or active layer 42 of still another n-type semiconductor material, such as GaAs, a third layer 43 of a p-type semiconductor material, such as $Al_xGa_{1-x}As$, a fourth layer 44 of an n-type semiconductor material, such as GaAs, and a stripe 45 doped with a p-type impurity, such as zinc, and extended from the fourth layer 44 into the third layer 43. The first through fourth layers 41–44 are stacked in sequence on the substrate 40 and provide a typical double heterostructure. The laser is substantially a rectangular parallelopiped in shape and has a resonator length L, an overall width, and a thickness, the thickness being depicted vertically in FIGS. 1 and 2. Although not specifically indicated by reference numerals, a pair of reflection or mirror surfaces of a laser resonator is provided by those facets of the double heterostructure of the layers 41–44 which are at both ends of the length L. It is possible to provide the active layer 42 with p-type conductivity and by the use of $Al_yGa_{1-y}As$ where $y$ is less than $x$. The laser further comprises a pair of electrodes 46 and 47 in ohmic contact with the substrate 40 and the fourth layer 44, respectively. The stripe 45 is extended between the mirror surfaces and has a stripe width W and a high concentration of the p-type impurity, or $p^+$-type impurity, as indicated in FIG. 2 illustrating a section taken on a plane parallel to the mirror surfaces. The $p$ and $n$ types of conductivity of the double heterostructure layers 41–44 are varied by the impurities doped in the respective layers 41–44 with impurity concentrations exemplified in FIG. 3 where the abscissa and ordinate represent the thickness or depth and the concentration in atoms per cubic centimeter, respectively. As exemplified also in FIG. 3, the impurity concentration of the stripe 45 is selected between $10^{19}$ and $10^{20}$ atoms per cubic centimeter. The active layer 42 has a uniform distribution of dielectric constant throughout the overall width as shown in FIG. 4 although the distribution somewaht varies when carriers are injected into the active layer 42.

Figure 6:
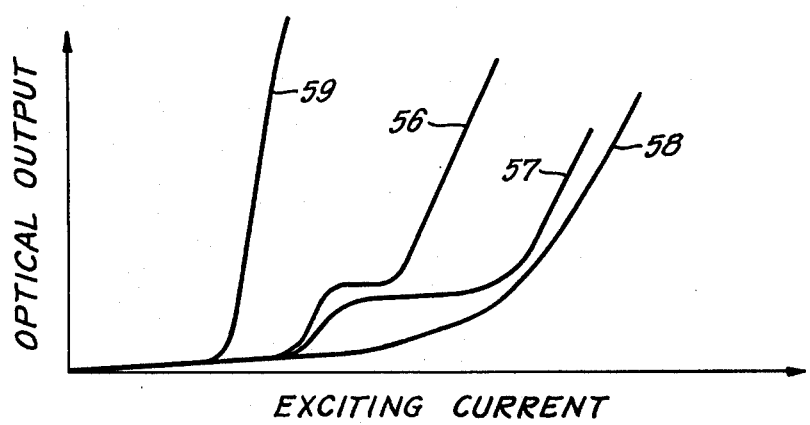
FIG. 6 shows characteristic curves of conventional stripe geometry multiple heterostructure semiconductor lasers.

Referring to FIGS. 5 and 6, it should be mentioned here that a stripe width W is set between 10 and 20 microns in most conventional stripe geometry lasers. An exciting electric current composed of rectangular pulses of a pulse width of 120 ns was supplied with a low duty ratio, such as about 1% or less, to a laser of the planar stripe geometry structure illustrated with reference to FIGS. 1 through 4. The laser had a typical resonator length L of 250 microns and a relatively narrow stripe width W of 15 microns. The active layer 42 was 0.2 micron thick. As best shown in FIG. 5, where the abscissa and ordinate represent the pulse height of the exciting current in mA and an optical output of the laser in mW, respectively, laser oscillation suddenly takes place to make the laser produce an appreciable optical output as shown by an optical output versus exciting current characteristic curve and more particularly indicated at 50 when the exciting current reaches a threshold current density. The output-current curve has two kinks above the threshold at 50, namely, a convex and a concave turn shown at 51 and 52. Like curves are again depicted in FIG. 6 at 56 and 57. Furthermore, the maximum optical output of an effective zeroth or fundamental transverse mode of the laser oscillation is only 5 mW, as can be understood from the convex turn 51. In particular, a reduction in the stripe width W to about 10 microns or less gives rise to a reduction in the differential quantum efficiency and an appreciable rise of the threshold current density, as exemplified in FIG. 6 at 58, by an optical output versus exciting current curve of a laser having a stripe width W of about 5 microns or less.

Further referring to FIGS. 1 through 4 and FIG. 6, the high threshold current density and the low efficiency result from the facts that the active layer 42, which is homogeneous transversely of the stripe 45, is incapable of confining the transverse-mode laser oscillation to a stripe region or laser oscillation producing region directly under in the active layer 42 the stripe 45 and that the confinement is achieved by the optical guiding or guidance resulting from the optical amplification gain of the injected carriers concentrated mainly in the stripe region although the confinement by a pair of heterojunction interfaces defining the active layer 42 is not objectionable in a direction perpendicular to the interfaces. The transverse-mode laser oscillation thus diffuses as wide transversely to the stripe region as the distribution of the injected carriers, when the stripe width W is about 5 microns or less, into those regions contiguous in the active layer 42 to the stripe region which have little injected carriers and are consequently light absorbing. In addition, the injected carriers have a mountain-shaped distribution in the stripe region. This provides negative optical guiding (light-diverging action) to spread the transverse-mode oscillation. The exciting current is not confined, either, but spread in the third and second layers 43 and 42 transversely of the stripe 45 so as to flare outwardly of the stripe width W to give rise to unnecessary current consumption. The failure to confine the exciting current plays a part in adversely affecting the efficiency and the optical output versus exciting current characteristics.

Still further referring to FIGS. 1 through 4 and FIG. 6, it is unfavorable with a conventional laser of the type described to render the stripe width W narrower than about 10 microns due to the high threshold current density, low efficiency, and objectionable optical output versus exciting current characteristics as described in the next preceding paragraph. When the stripe width W is wider than several tens of microns, the injected carriers have a flat distribution of concentration in the stripe region. The laser oscillation occurs in the center portion of the flat distribution. Radiation induced by the laser light reduces the injected carriers to sometimes produce an indent in the flat distribution. Positive optical guiding (light-converging action) therefore results, whereby the transverse-mode laser oscillation is confined towards the center of the stripe region of a high optical amplification gain and is not adversely affected by the contiguous regions where the gain is low (loss is high) due to low carrier concentrations. This lowers the threshold current density and raises the efficiency as exemplified in FIG. 6 at 59. Higher-order transverse modes of the laser, however, are liable to occur with a wide stripe width W. The resulting multi-transverse modes of oscillation render the transverse-mode oscillation unstable and the characteristics are usually not reproducible. The above-described inconveniences are unavoidable also with conventional stripe geometry multiple heterostructure semiconductor lasers of an electrode type and a low mesa type. With a laser of the planar type, the stripe 45 is of a high impurity concentration exemplified hereinabove and is extended as deep from the surface of the heterostructure as between 1 and 2 microns. Crystal defects are therefore liable to occur in the stripe region due to a considerably strong stress (about $10^8$ dyn/cm$^2$) to which the stripe region is subjected unless the $p^{30}$-type impurity doping is controlled with great care.

With a conventional stripe geometry multiple heterostructure semiconductor laser of a proton bombardment type wherein the proton bombardment is carried out into the active layer, the path of the exciting electric current is confined substantially within the stripe width W by the high resistance domains formed as the contiguous regions in the active layer by the proton bombardment. The high resistance domains, however, make the injected carriers recombine without radiation of light. This means a loss in the injected carriers. In addition, these domains have a higher dielectric constant and an accordingly higher refractive index than the stripe region. The refractive index profile along the overall laser width tends to pull the laser oscillation away from the stripe region. This reduces the efficiency. Due to these facts, a stripe width W narrower than about 10 microns is unfavorable.

With a conventional stripe geometry buried multiple heterostructure semiconductor laser, the stripe region is restricted by a considerably wide band gap on both horizontal sides by the contiguous regions as well as on both vertical sides by juxtaposed layers (for example, a band gap of 1.8 eV for the contiguous regions and juxtaposed layers of $Al_{0.3}Ga_{0.7}As$ in contrast to a band gap of 1.4 eV for the stripe region of GaAs). The exciting electric current is therefore confined to the stripe region. The carrier recombination occurs only within the stripe width W. The dielectric constant is higher in the stripe region (by about 3%) than in the contiguous regions and juxtaposed layers. The laser oscillation is therefore completely confined in the stripe region. As a result, it is possible to reduce the stripe width W to about 1 micron with no adverse effects on the threshold current density and the efficiency. The method of manufacture, however, is complicated. It is indispensable to twice carry out epitaxial growth and to resort to mesa etching between the two epitaxial growth steps to form the stripe region. In addition, the adjacency of the stripe region is exposed to atmosphere on carrying out the mesa etching step. This makes it difficult to obtain a laser crystal having no defects and consequently to manufacture with a high yield a laser having less deteriorating liability and a long device life. The considerably higher dielectric constant of the stripe region liably makes the laser oscillation have a plurality of transverse modes even when the stripe width W is wider than only about 1 micron. With a stripe width W narrower than about 1 micron, continuous operation is limited to several milliwatts or less of the output due to damages caused by the optical output to the end facets.

With a conventional stripe geometry multiple heterostructure semiconductor laser known as TJS (transverse junction stripe) laser wherein the $p^+$-type impurity is diffused along the heterojunction interface, the laser characteristics are admittedly improved by the dielectric constant profile formed in the active layer. The active layer has, however, an asymmetric $p^+$-p-n structure as an inevitable result of the impurity diffused from one side towards another. The stripe region is therefore uniquely decided by the profile of the impurity concentration rather than being freely optionally selected. In fact, the stripe region is about 2 microns wide. It is therefore impossible to obtain a high optical output. The high impurity concentration region offset to one side of the stripe region results in the absorption of the laser oscillation to lower the efficiency and to render the near-field pattern and the far-field pattern asymmetric. The high impurity concentration undesirably serves as an intrinsic factor for deteriorating the laser.

Turning now to FIGS. 7 through 10, a planar stripe geometry double heterojunction semiconductor laser according to a first embodiment of the present invention comprises similar parts designated by like reference numerals as in FIGS. 1 and 2. It should, however, be pointed out that the stripe 45 reaches the first or base layer 41 beyond the second or active layer 42 so as to clearly identify a stripe region 60 from regions contiguous in the active layer 42 thereto and that the impurity concentration in the stripe 45 is typically about $10^{18}$ atoms per cubic centimeter, being considerably lower than the concentration in a conventional stripe 45. As exemplified in FIGS. 8 and 9, the concentration of the n-type doping in the first layer 41 is not rendered so high that the relatively low concentration of the impurity doping in the stripe 45 defines a p-type domain 61 therein. After formation of the stripe 45, a p$^+$-type impurity, such as zinc, is diffused to a high concentration, such as $10^{19}$–$10^{20}$ atoms per cubic centimeter, into the fourth layer 44 to a shallow depth, such as 0.2 micron, to form a p$^+$-type layer 64 for reducing the ohmic resistance between the electrode 47 and the laser element. It should also be pointed out that the dielectric constant in the stripe region 60 is rendered a little higher than in the contiguous regions as depicted in FIG. 10. Although dependent on the field of application of the laser, the difference in dielectric constant is selected to fall approximately between 0.01 and 1%. This difference is considerably smaller than the conventional difference of about 3% described hereinabvoe in conjunction with a buried heterostructure laser.

Figure 11:
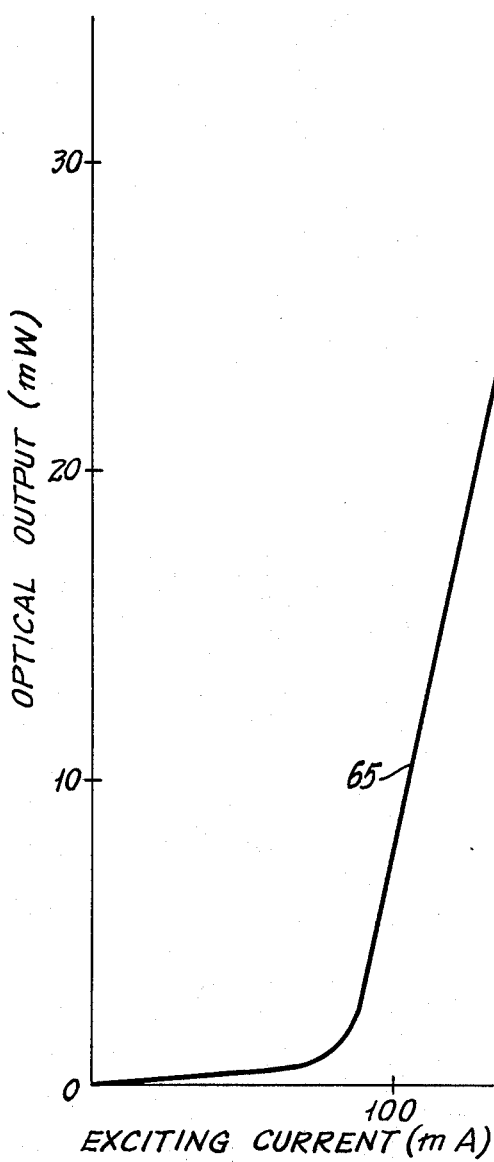
FIG. 11 shows a characteristic curve of the laser illustrated in FIGS. 7 and 8.

Referring to FIGS. 7 through 10 again and to FIG. 11, the difference in dielectric constant along the active layer 42 provides the positive optical guiding. Confinement of the laser oscillation to the stripe region 60 in the direction transversely of the stripe 45 depends on the positive optical guiding, and scarcely depends on the concentration distribution of the carriers injected into the active layer 42. It is therefore possible even with a narrower stripe width W, such as from about 10 microns to about 1 micron, than the widths W for conventional lasers of the types described except the buried heterostructure type to make a laser according to this invention produce a linear optical output in a single stable fundamental or lower-order transverse mode, a low threshold current density, and a high efficiency. For instance, an optical output versus exciting current curve actually obtained by the use of a laser having the structure illustrated with reference to FIGS. 7 through 10 and the same dimensions as the conventional laser whose output characteristic is depicted in FIG. 5 and by the use of the exciting electric current used therefor is, as shown in FIG. 11 at 65, coincident with the curve 59 (FIG. 6) for a conventional laser of like structure but having a wide a stripe width W as several tens of microns. It has been observed that the optical output is of the fundamental mode even at as high a power as 30 mW. The power obtainable with a laser according to this invention is thus higher than that achieved with a buried heterostructure semiconductor laser.

Further referring to FIGS. 7 through 10, the distribution of impurity doping by which the dielectric constant is raised in the stripe region 60 reduces in general the band gap of the stripe region 60 as compared with that in the contiguous regions of the active layer 42 by a difference equal to a thousandth of from several electron volts to several tens of electron volts. The band gap difference tends to confine the carriers injected into the active layer 42 so as to make them recombine mainly in the stripe region 60 and to minimize the diffusion of carriers away therefrom. The confinement of the transverse-mode laser oscillation and the injected carriers give rise to the low threshold current density and the high efficiency. Inasmuch as the diffusion length of the carriers is about 5 microns, the carrier concentration is rendered uniform in the stripe region 60 of a stripe width W narrower than about twice the diffusion length. With a stripe width W wider than about 10 microns and even with a stripe width W as wide as several tens of microns, it has been confirmed that a laser having the structure according to this invention is capable of stably producing an optical output of a single lower-order transverse mode. The relatively low impurity concentration in the stripe 45 and the very thin thickness and the wide spread over the overall laser width of the high impurity concentration layer 64 apply little stress to the stripe region 60. Absorption of the laser oscillation is avoided because the p$^+$-type layer 64 is formed in the third or fourth layer 43–44 of a high band gap.

Figure 12:
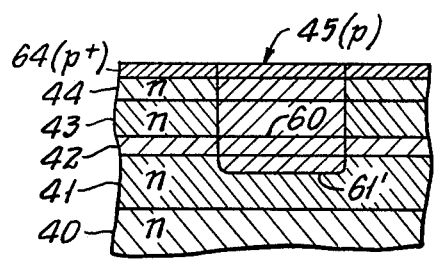
FIG. 12 is a schematic sectional view, similar to FIG. 2 or 8, of a laser according to a second embodiment of this invention.
Figure 13:
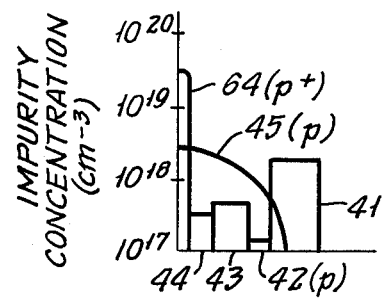
FIG. 13 schematically illustrates the distribution of impurity concentrations in a laser illustrated in FIG. 12.
Figure 14:
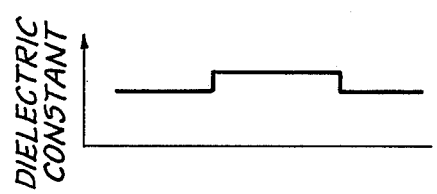
FIG. 14 schematically illustrates the distribution of dielectric constant in an active layer of the laser depicted in FIG. 12.

Referring now to FIGS. 12 through 14, a laser according to a second embodiment of this invention comprises similar parts designated by like reference numerals as in FIGS. 7 and 8. As shown in FIGS. 12 and 13, the first layer 41 is doped with a higher concentration, such as $2 \times 10^{18}$ atoms per cubic centimeter, than the concentration of the p-type impurity doped therein so as to keep the n-type conductivity throughout. In other words, no p-type domain 61 is formed in the first layer 41 although a similar domain 61' is depicted in order to show a p-type impurity front. Each of the second or active and the third layers 42–43 has an n-type conductivity of an impurity concentration lower than the stripe 45, such as $0.5 \times 10^{18}$ atoms per cubic centimeter for the third layer 43. It is possible to provide the third layer 43 with a p-type conductivity as in lasers illustrated with reference to FIGS. 1–5 and 7–11. As depicted in FIG. 14, the distribution the dielectric constant throughout the overall laser width of the active layer 42 is similar to that shown in FIG. 10.

Turning to FIGS. 15 through 18, a laser according to a third embodiment of this invention comprises similar parts designated by like reference numerals as in FIGS. 7, 8, and 12. It is seen, however, that the first through third layers 41–43 are of n-type conductivity. Inasmuch as the third layer 43 is of n-type conductivity, use is not made of the fourth layer 44. Accordingly, the high-concentration p-type layer 64 is formed in the third layer 43. Despite the ohmic contact of the electrode 47 with the third layer 43 of the n-type conductivity, the forward bias applied across the laser hardly causes the exciting electric current to flow into the third layer 43 outwardly of the stripe 45 formed therein because the diffusion potential of the p-n junction formed between the p$^+$-type layer 64 and the remaining portion of the third layer 43 of a wide band gap, such as 1.8 eV for a third layer 43 of $Al_{0.3}Ga_{0.7}As$, is higher than the diffusion potential of the p-n junction for the active layer 42, such as 1.4 eV for an active layer 42 of GaAs, as is the case with the known buried heterostructure semiconductor laser.

Further referring to FIGS. 15 through 18, the first through third layers 41–43 are formed on the substrate 40 in sequence by a typical liquid-phase epitaxial growth technique. It is thus possible to form the heterostructure with doping by a single continuous step of the epitaxial growth. A conventional method of zinc diffusion using a metal zinc source and a closed pipe may be resorted to on forming the stripe 45 doped with zinc. The conventional diffusion is more favorably carried out at a lower temperature, such as between about 500° and 600° C, for a longer time, such as from several hours to several hundreds of hours. A two-stage zinc diffusion method employing an oxide doping technique may be used to advantage in the formation of the stripe 45 of a low impurity concentration, as described hereinabove, and of a deep depth, such as from several microns to about 10 microns. Alternatively, the zinc may be diffused at first to a conventional high concentration and to a conventional shallow depth. Subsequent proton bombardment carried out at a temperature of between about 400 and 500° C onto the conventionally diffused zinc makes the high-concentration zinc diffuse along crystal defects formed by the bombarding protons. The depth is adjusted by the range of the protons (about 3 microns at the proton energy of 300 keV). The concentration is adjusted by the initial concentration. As the case may be, the p$^+$-type layer 64 is formed as a thin layer preliminarily epitaxially grown by the doping of an impurity, such as germanium, which gives a low diffusion coefficient. It is also possible to form the stripe 45 by doping carried out simultaneously with the epitaxial growth of the heterostructure. On forming the stripe 45, it is possible to use a desired one of other p-type impurities among which beryllium, magnesium, cadmium, and silicon are preferred.

Referring back to FIGS. 7-10 and 12-14, it is not easy to make the diffusion front just reach the heterojunction interface between the base and active layers 41-42. The diffusion front is therefore allowed to proceed into the first layer 41. In a laser illustrated with reference to FIGS. 12-14, the first layer 41 is given a high doping level of an n-type impurity while being epitaxially grown. It is necessary on giving an $Al_{0.3}Ga_{0.7}As$ layer the high n-type doping concentration to use sulphur or tellurium because it is difficult to achieve the high concentration by the use of silicon or tin. Sulphur and tellurium, however, are liable to produce undesirable segregation in the crystal depending on the conditions of doping. In contrast, it is possible for a laser illustrated with reference to FIGS. 7-10 to use tin and to resort to low-temperature growth whereby layer thicknesses are readily controlled and high quality is insured to the grown crystal. When the impurity concentration of the first layer 41 is rendered low in a laser illustrated with reference to FIGS. 15-18 as in the laser shown in FIGS. 7-10, doping of a specific n-type impurity is unnecessary. In any event, the diffusion is successfully carried out even though the thickness of the third and/or fourth layers 43-44 is uneven in a wafer.

Figure 19:
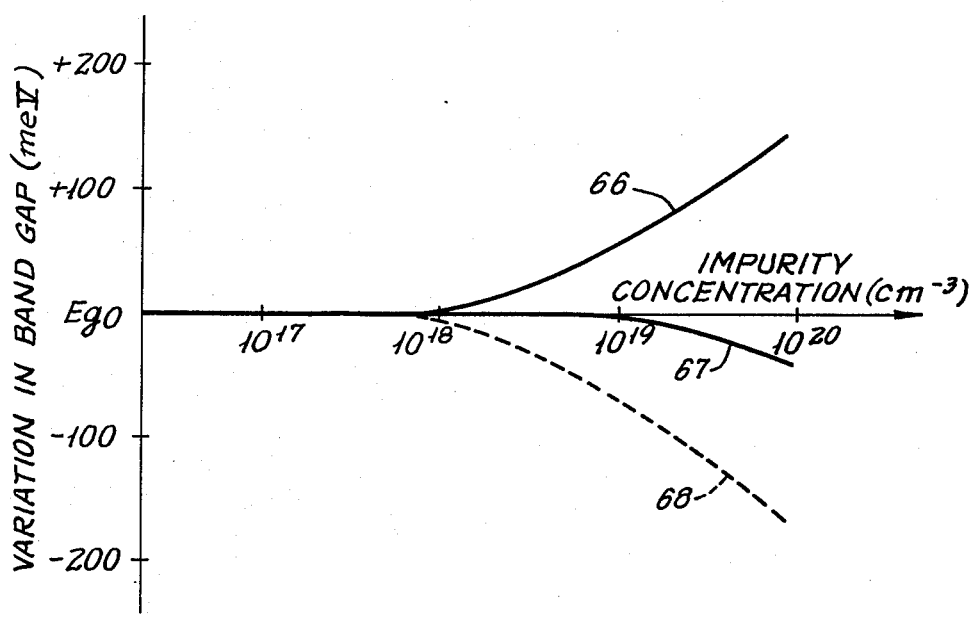
FIG. 19 is a graphical representation of band gap variation versus impurity concentration.

Referring to FIG. 19 wherein the abscissa and ordinate represent the impurity concentration in atoms per cubic centimeter and the band gap variation in meV, a symbol $Eg_0$ shows that the band gap variation is zero in an undoped layer while reference numerals 66, 67, and 68 show the variations versus the impurity concentrations in layers of binary, ternary, and quaternary III-V-Group semiconductor materials for an n-type impurity, a p-type impurity, and an equal or compensating amount of n-type and p-type impurities, respectively. The variation in the dielectric constant is approximately inversely proportional to the variation in the band gap, a variation of 100 meV in the band gap corresponding to a variation of about 1% in the refractive index which, in turn, is proportional to the square root of the dielectric constant. It is now understood that various combinations of kinds and/or concentrations of impurity are possible to realize the difference in impurity on giving the stripe region 60 a higher dielectric constant and a narrower band gap than the contiguous region or regions.

Referring again to FIGS. 7 through 19, a difference $\Delta\epsilon$ of dielectric constant $\epsilon$ between the stripe region 60 and the contiguous region or regions depends in general on the kind and the concentration of impurity with which the whole active layer 42 is doped. For simplicity, let diffusion be carried out to form the stripe 45. As shown in FIG. 19 by the curve 67, the difference $\Delta\epsilon$ is greater when the whole active layer 42 has a lower concentration of a p-type impurity. Accoring to the curve 68, the difference $\Delta\epsilon$ is greater when the active layer 42 has a higher concentration of an n-type impurity insofar as the concentration is lower than that of the diffused p-type impurity. When the active layer 42 is preliminarily doped with an n-type impurity to a relatively high concentration, such as $10^{18}$ atoms per cubic centimeter or more, diffusion of a p-type impurity to an approximately equal concentration gives rise to a band tail effect and a reduction in the band gap due to the impurity compensation whereby it is possible to achieve in the stripe region 60 a difference of 30 meV or more in the band gap and of 0.3% or more in the dielectric constant as compared with the contiguous region. Preferred n-type impurities are sulphur, selenium, tellurium, silicon, and tin.

It has now been found that a lower-order transverse mode of laser oscillation is obtained in a laser according to this invention as a result of a cutoff phenomenon for higher-order transverse modes which depends, among others, on the stripe width W and the difference $\Delta\epsilon$ in the dielectric constant. More particularly, a certain step $\Delta\epsilon^*$ in the dielectric constant is found for a given stripe width W at which the fundamental transverse mode stably appears while higher-order transverse modes are cut off. The step $\Delta\epsilon^*$, as called herein, in the dielectric constant is not the difference $\Delta\epsilon$ per se but the difference $\Delta\epsilon$ corrected by the positive optical guidance resulting from the gain determined by distribution of the injected carriers, the negative optical guidance determined by distribution of the refractive index, and other factors. When the difference $\Delta\epsilon$ is less than the step $\Delta\epsilon^*$, it is possible to obtain laser oscillation of a single fundamental transverse mode. When the former is greater than the latter, as in a buried heterostructure laser, the possibility occurs that higher-order transverse modes will appear simultaneously. The step $\Delta\epsilon^*$ decreases in compliance with the inverse square of the stripe width W. A smaller and a relatively greater difference $\Delta\epsilon$ in dielectric constant is therefore favorable when the stripe width W is wide and narrow, respectively. In practice, the injected carriers manifest the negative dielectric constant effect to complicate the cutoff phenomenon. In any event, the difference in impurity should be selected for best operation of a laser according to this invention so that the difference $\Delta\epsilon$ in dielectric constant may have a sufficient value and a favorable distribution for making the positive optical guidance resulting from the gain determined by the carrier distribution, the negative optical guidance resulting from the refractive index distribution, the positive optical guidance resulting from the dielectric constant difference $\Delta\epsilon$ per se, and others stabilize a single desired transverse mode.

Figure 20:
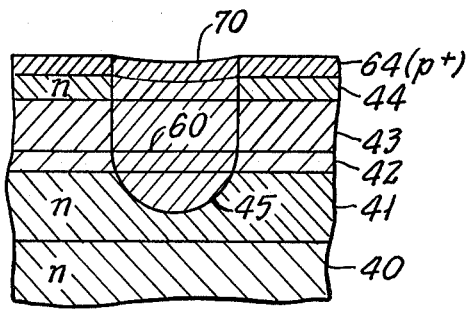
FIG. 20 is a schematic sectional view, similar to FIG. 8 or FIG. 16, of a laser according to a fourth embodiment of this invention.
Figure 21:
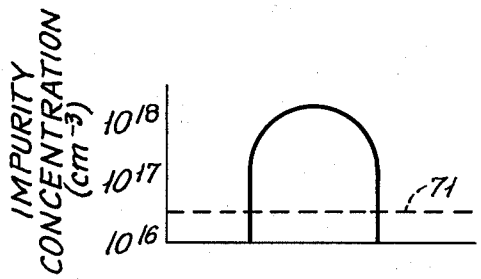
FIG. 21 schematically illustrates the distribution of impurity concentrations in the laser illustrated in FIG. 20.
Figure 22:
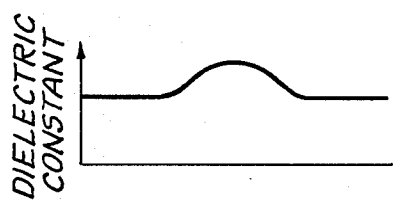
FIG. 22 schematically illustrates distribution of dielectric constant in an active layer of the laser depicted in FIG. 20.

Turning now to FIGS. 20 through 22, a laser according to a fourth embodiment of this invention again comprises similar parts designated by like reference numerals as in FIGS. 7, 8, and 12. The fourth layer 44, however, has a concave indent 70. The conductivity types of the second and third layers 42-43 are not indicated because they are optional. The indent 70 is formed by selective etching known in the art, with a photoresist mask (not shown) preliminarily formed on the exposed surface of the fourth layer 44. Alternatively, it is possible to resort to ion milling or other known techniques. The zinc diffusion gives a convex distribution to the impurity concentration and the dielectric constant as exemplified in FIGS. 21 and 22, respectively. In FIG. 21, a horizontal broken line 71 represents the impurity concentration of the active layer 42 as grown epitaxially from the liquid phase. This renders the distribution of the injected carriers uniform throughout the stripe region 60 to produce a uniform optical amplification gain. The laser light is effectively confined towards the center portion of the highest refractive index. With a stripe width W selected between 5 and 10 microns, the output power of the fundamental transverse mode was beyond 10 mW in continuous-wave operation.

Figure 23:
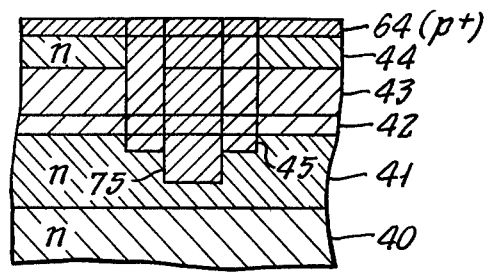
FIG. 23 is a schematic sectional view, similar to FIG. 8 or FIG. 16, of a laser according to a fifth embodiment of this invention.
Figure 24:
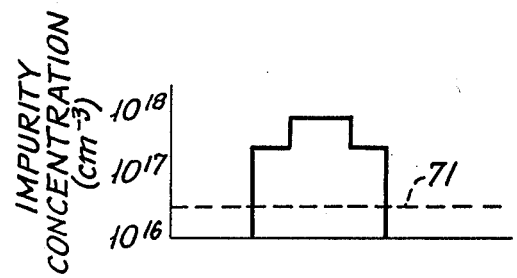
FIG. 24 schematically illustrates the distribution of impurity concentrations in the laser depicted in FIG. 23.
Figure 25:
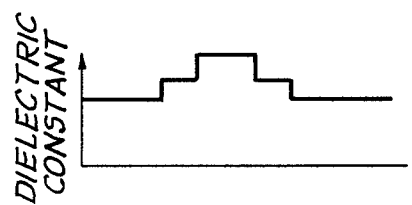
FIG. 25 schematically illustrates the distribution of the dielectric constant in an active layer of the laser shown in FIG. 23.

Referring to FIGS. 23 through 25, a laser according to a fifth embodiment of this invention comprises similar parts designated by like reference numerals as in FIG. 20. The zinc diffusion, however, is carried out in two steps to form an overall or shallower stripe 45 and an inner or deeper stripe 75 of a higher zinc concentration. With overall and inner stripe widths of 15 and 8 microns, it was possible to produce a continuous optical output of a power beyond 10 mW as was the case with a laser illustrated with reference to FIGS. 20-22.

Figure 15:
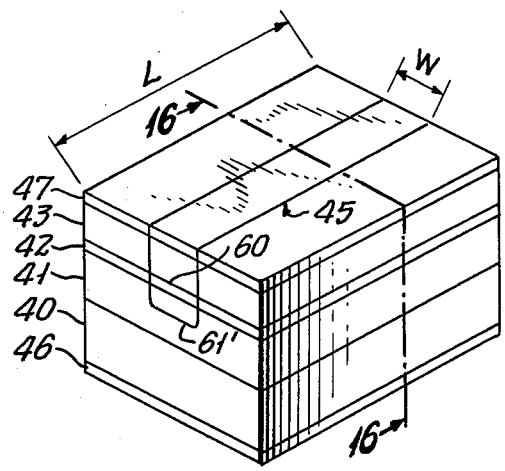
FIG. 15 is a schematic perspective view of a laser according to a third embodiment of this invention.
Figure 16:
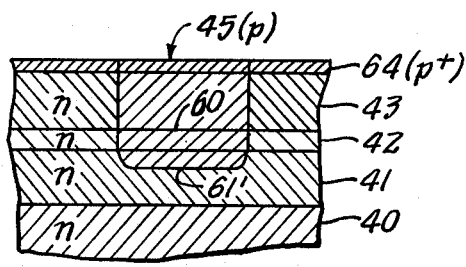
FIG. 16 shows a schematic section taken on a plane indicated in FIG. 15 by a line 16—16.
Figure 18:
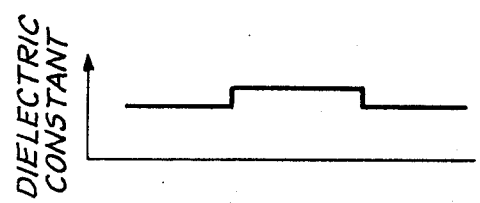
FIG. 18 schematically illustrates the distribution of dielectric constant in an active layer of the laser shown in FIGS. 15 and 16.
Figure 17:
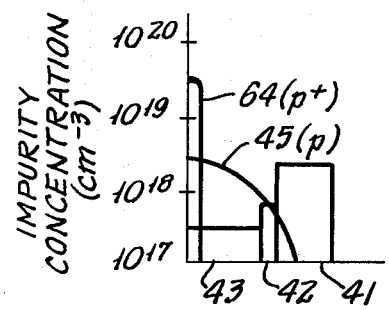
FIG. 17 schematically illustrates the distribution of impurity concentrations in the laser depicted in FIGS. 15 and 16.
Figure 26:
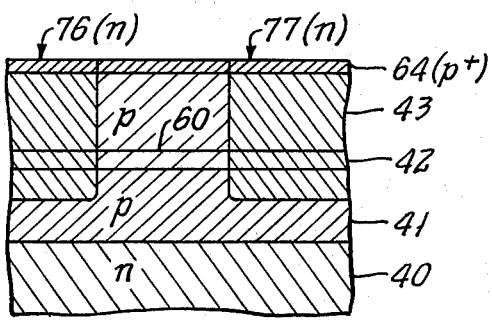
FIG. 26 is a schematic sectional view, similar to FIG. 8 or FIG. 16, of a laser according to a sixth embodiment of this invention.
Figure 27:
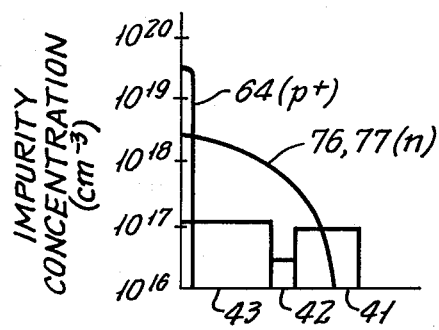
FIG. 27 schematically illustrates the distribution of impurity concentrations in the laser depicted in FIG. 26.
Figure 28:
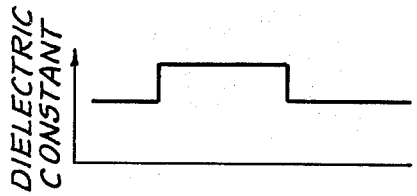
FIG. 28 schematically illustrates the distribution of the dielectric constant in an active layer of the laser shown in FIG. 26.

Referring to FIGS. 26 through 28, a laser according to a sixth embodiment of this invention comprises similar parts designated by like reference numerals as in FIGS. 15-16. The first and third layers 41 and 43 are of p-type conductivity. The second or active layer 42 may be whichever of p-type conductivity of a low impurity concentration and n-type conductivity. The stripe region 60 is defined by a pair of domains 76 and 77 doped with an n-type impurity and extended into the first layer 41 through the active layer 42. The n-type impurity is preferably selected from Group IVb of the periodic table of elements, such as sulphur, selenium, and tellurium. The band gap of the stripe region 60 is rendered narrower than that of the contiguous regions defined in the active layer 42 by the n-type impurity doped domains 76-77. It is possible to achieve the narrower band gap and accordingly higher dielectric constant by giving the stripe region an n-type or p-type impurity concentration less than about $10^{17}$ atoms per cubic centimeter and by giving the contiguous regions an n-type impurity concentration of $10^{18}$ atoms per cubic centimeter or more. When the stripe region 60 includes only the p-type impurity, the concentration therein of the n-type impurity should be regarded as zero.

Figure 29:
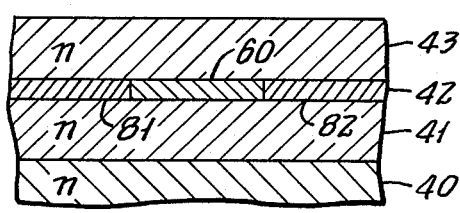
FIG. 29 is a schematic sectional view, similar to FIG. 8 or FIG. 16, of a laser according to a seventh embodiment of this invention.

Turning to FIG. 29, a laser according to a seventh embodiment of this invention comprises similar parts designated by like reference numerals as in FIGS. 15-16. The stripe region 60 is formed by selective doping during the epitaxial growth. The impurity concentration in the first and third layers 41 and 43 is therefore uniform. The laser may have a fourth layer shown, for example, in FIGS. 7-8 at 44. In this event, it is possible to regard the third and fourth layers 43-44 as a single layer overlying the active layer 42 and underlying the adjacent electrode 47 and to say that the overlying layer has a uniform distribution of an impurity in a direction parallel to the active layer 42. Alternatively, the stripe region 60 is defined by contiguous regions 81 and 82 selectively doped with an n-type impurity at a higher concentration than the stripe region 60 as in a laser illustrated with reference to FIGS. 26-28. The p$^+$-type layer 64 is not depicted because the layer 64 is optional.

Figure 30:
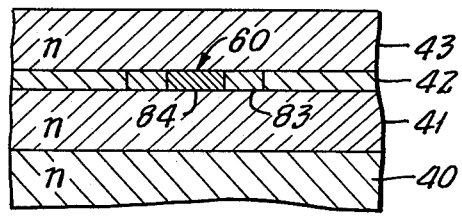
FIG. 30 is a similar sectional view of a laser according to an eighth embodiment of this invention.

Referring to FIG. 30, a laser according to an eighth embodiment of this invention comprises similar parts designated by like reference numerals as in FIGS. 23 and 29. The stripe region 60 comprises a first portion 83 nearer to the contiguous region and a second portion 84 farther therefrom. The first portion 83 is selectively doped with a p-type impurity with a lower concentration than the second portion 84 as in a laser illustrated with reference to FIGS. 20-22 or 23-25.

Figure 31:
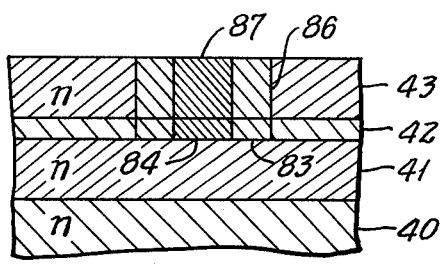
FIG. 31 is a similar sectional view of a laser according to a ninth embodiment of this invention.

Referring to FIG. 31, a laser according to a ninth embodiment of this invention comprises similar parts designated by like reference numerals as in FIGS. 23 and 30. Besides the first and second portions 83-84 of the stripe region 60, the laser comprises in the overlying layer 43 or 43-44 first and second partial domains 86 and 87 extending substantially perpendicularly of the active layer 42 between the first and second portions 83-84 and that the planar surface of the overlying layer on which the electrode 47 (not depicted herein) is extended. The first and second partial domains 86-87 are formed during diffusion of the p-type impurity into the stripe region 60 as in a laser illustrated with reference to FIGS. 20-22 or 23-25. The diffusion front, however, is controlled so as not to proceed into the first layer 41. Alternatively, the first layer 41 is provided with a relatively high n-type impurity concentration so as to keep the n-type conductivity even when the diffusion front reach thereinto. It is also possible to form the partial domains 86-87 by selective doping during the epitaxial growth.

Figure 32:
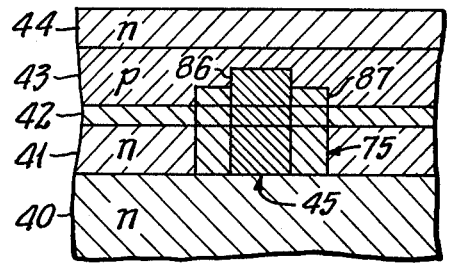
FIG. 32 is a similar sectional view of a laser according to a 10th embodiment of this invention.

Referring to FIG. 32, a laser according to a tenth embodiment of this invention comprises similar parts designated by like reference numerals as in FIGS. 7-8 and 23. The shallower and deeper stripes 45 and 75 are formed by diffusion to reach the third layer 43. The diffusion is carried out by placing pertinent quantities of the impurity to be included in the stripe region 60 on and/or in the substrate 40 and by making the last-mentioned impurity diffuse either during the epitaxial growth or thereafter. That domain of the first layer 41 through which the impurity is diffused should have a wider band gap than the stripe region 60.

Figure 33:
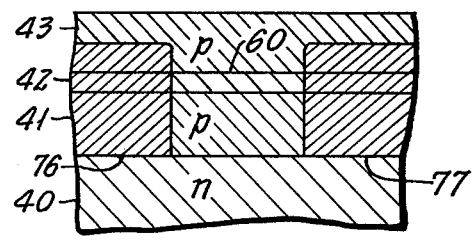
FIG. 33 is a similar sectional view of a laser according to an 11th embodiment of this invention.

Finally referring to FIG. 33, a laser according to an eleventh embodiment of this invention comprises similar parts designated by like reference numerals as in FIGS. 15-16 and 26. The n-type domains 76-77 are formed by preliminarily depositing a sufficient quantity of an n-type impurity on and/or in the substrate 40 and by diffusing the impurity either during or after the epitaxial growth.

In conjunction with use of a laser in optical fiber communication, a lower-order transverse mode of the laser oscillation is important, besides a small-diameter beam, to raise the efficiency of coupling of the optical output to the optical fiber. A higher power is also desirable. In these respects, a laser according to this invention is very favorable.

Video disks have recently been proposed wherein use is made of helium-neon gas lasers. It is believed that the gas laser will be replaced by a semiconductor laser because the latter is compact and operates at a high efficiency. Sharp focusing of the order of 1 micron, however, is mandatory. It has been difficult to achieve the focusing with a conventional stripe geometry laser, which provides a linear (for example, 1 × 10 microns) light source. Although it is possible to achieve the focusing by the use of a simple convex lens, a buried heterostructure laser is unfavorable because it is difficult to manufacture buried heterostructure lasers on a large scale. Furthermore, a buried heterostructure laser is expensive. In contrast, lasers according to this invention are suitable also to video disks.

While several preferred embodiments of this invention and various modifications thereof have thus far been described, conventional planar stripe lasers are manufactured with a high yield and have a life of 10,000 hours or more if the layer thicknesses and the zinc diffusion are controlled with care. A laser according to this invention is more readily manufactured with excellent reproducibility and excellent characteristics as described hereinabove. This invention is equally well applicable to a multiple heterostructure laser of an $In_x$-$Ga_{1-x}As_yP_{1-y}$ and $In_pGa_{1-p}As_qP_{1-q}$ system, a $Pb_ySn_{1-y}Te$ and $Pb_xSn_{1-x}Te$ system, or a like system and to a laser of a quadruple heterostructure (separate confinement heterostructure), of a large optical cavity type, of a single heterostructure, or of any other structure. It is possible to make a laser according to this invention have either a stripe region along a widthwise end of an active layer or a plurality of stripe regions in a single active layer. It is also possible to select the conductivity types and concentrations of impurities doped in the stripe and/or contiguous regions and in the overlying and inner layers 43–44 and 41 in consideration of the curves depicted in FIG. 19 and similar curves.

What is claimed is:

1. In a stripe geometry heterostructure semiconductor laser comprising a multiple heterojunction semiconductor crystal having a pair of principal surfaces, a pair of end surfaces transversely of said principal surfaces, and a pair of side surfaces transversely of said principal and said end surfaces, a pair of reflection surfaces on the respective end surfaces, and a pair of electrodes on the respective principal surfaces, said crystal including only one active layer bounded by a pair of heterojunction interfaces and said end and said side surfaces, said active layer comprising a stripe region extending between said end surfaces and a contiguous region between said stripe region and at least one of said side surfaces, said interfaces being substantially parallel to each other at least at their portions defining said stripe region, said stripe region being in substantial coincidence with an oscillation producing region where laser oscillation takes place, said oscillation producing region being restricted by said interfaces in a first direction perpendicular to said interfaces, said stripe region and said contiguous region having different impurity characteristics such that said stripe region has a higher dielecric constant than said contiguous region, whereby said oscillation producing region is restricted to said stripe region in a second direction parallel to said interfaces and said laser oscillation is stabilized to a single fundamental transverse mode.

2. A laser as claimed in claim 1, wherein said difference in impurity gives said stripe region a dielectric constant higher than the dielectric constant of said contiguous region by a difference selected between about 0.01% and about 1% of the last-mentioned dielectric constant.

3. A laser as claimed in claim 2, wherein said difference in impurity gives said stripe region a band gap narrower by a difference selected between about 5 meV and about 100 meV than the band gap of said contiguous region.

4. A laser as claimed in claim 2, said crystal being of III-V-Group semiconductor materials, wherein said difference in impurity is provided by the facts that a dielectric constant of each of said semiconductor materials decreases by addition thereto of an n-type impurity, increases by addition thereto of a p-type impurity, and increases by a greater difference by addition thereto of an equal quantity of an n-type and a p-type impurity than the increase resulting from addition thereto of only a p-type impurity, an increase and a decrease in the dielectric constant of any one of said semiconductor materials decreasing and increasing the band gap of said one semiconductor material, respectively.

5. A laser as claimed in claim 4, wherein said stripe region includes a p-type impurity at a concentration higher than said contiguous region.

6. A laser as claimed in claim 5 wherein said crystal comprises an overlying layer between said active layer and one of said electrodes and an inner layer contiguous to said active layer along one of said interfaces that is farther from said one electrode than the other of said interfaces, each of said overlying and inner layers having a uniform distribution of an impurity in said second direction.

7. A laser as claimed in claim 5, wherein said crystal comprises an overlying layer between said active layer and one of said electrodes and an inner layer contiguous to said active layer between said end surfaces and along one of said interfaces that is farther from said one electrode than the other of said interfaces, said inner layer having a predetermined conductivity type, said inner layer comprising a first domain and a second domain contiguous to each other and to said stripe and said contiguous regions, respectively, said first domain including the p-type impurity included in said stripe region and having a wider band gap than said stripe region, said second domain not including said p-type impurity.

8. A laser as claimed in claim 7, wherein said first domain is of said predetermined conductivity type.

9. A laser as claimed in claim 7, wherein said first domain is of a p-type conductivity type.

10. A laser as claimed in claim 5, wherein said crystal comprises an overlying layer between said active layer and one of said electrodes and an inner layer contiguous to said active layer between said end surfaces along one of said interfaces that is farther from said one electrode than the other of said interfaces, said overlying layer including a domain between said stripe region and said one electrode, said domain including the p-type impurity included in said stripe region.

11. A laser as claimed in claim 5, wherein said stripe region includes the p-type impurity with a lower concentration in a first portion thereof that is nearer to said contiguous region than in a second portion thereof that is farther therefrom.

12. A laser as claimed in claim 11, wherein said crystal comprises an overlying layer between said active layer and one of said electrodes and an inner layer contiguous to said active layer along one of said interfaces that is farther from said one electrode than the other of said interfaces, said overlying layer comprising a domain between said stripe region and said one electrode, said domain comprising a first and a second partial domain contiguous to said first and second portions of said stripe region, respectively, said first partial domain including the p-type impurity included in said stripe region at a lower concentration than in said second partial domain.

13. A laser as claimed in claim 12, wherein said overlying layer has a planar surface on which said one electrode is extended.

14. A laser as claimed in claim 12, wherein said overlying layer has a surface on which said one electrode is extended, said surface having a first area and a second area, said first area being substantially planar, said second area being indented from said first area towards said active layer, said first partial domain reaching said second area at its portion adjacent to said first area, said second partial domain reaching said second area at its portion located away from said first area.

15. A laser as claimed in claim 4, wherein said contiguous region includes an n-type impurity at a concentration higher than said stripe region.

16. A laser as claimed in claim 15, further comprising a pair of electrodes sandwitching said crystal on both sides of said heterojunction interfaces, said crystal comprising an overlying layer between said active layer and one of said electrodes and an inner layer contiguous to said active layer along one of said interfaces that is farther from said one electrode than the other of said interfaces, wherein each of said overlying and inner layers has a uniform distribution of an impurity insofar as said second direction is concerned.

17. A laser as claimed in claim 15, wherein said crystal comprises an overlying layer between said active layer and one of said electrodes and an inner layer contiguous to said active layer between said end surfaces and along one of said interfaces that is farther from said one electrode than the other of said interfaces, said inner layer comprising a first domain and a second domain contiguous to each other and to said contiguous region, said first domain including the n-type impurity included in said contiguous region.

18. A laser as claimed in claim 15, wherein said crystal comprises an overlying layer between said active layer and one of said electrodes and an inner layer contiguous to said active layer between said end surfaces and along one of said interfaces that is farther from said one electrode than the other of said interfaces, said overlying layer comprising a domain contiguous to said contiguous region and including the n-type impurity included in said contiguous region.

* * * * *